(12) United States Patent
Lorenz

(10) Patent No.: US 6,777,781 B1
(45) Date of Patent: Aug. 17, 2004

(54) BASE-TO-SUBSTRATE LEAKAGE CANCELLATION

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/413,955

(22) Filed: Apr. 14, 2003

(51) Int. Cl.[7] ............................................. H01L 27/082
(52) U.S. Cl. ...................... 257/565; 257/563; 257/526; 257/557
(58) Field of Search ................................ 257/565, 563, 257/526, 557, 564, 358, 513

(56) References Cited

U.S. PATENT DOCUMENTS 6,369,646 B1 * 4/2002 Kesler et al. ............... 327/578
6,650,176 B1   11/2003 Lorenz

* cited by examiner

Primary Examiner—Steven Loke
Assistant Examiner—Thomas Magee
(74) Attorney, Agent, or Firm—Darby & Darby P.C.; Matthew M. Gaffney

(57) ABSTRACT

The operating temperature range for a vertical PNP transistor can be extended by applying cancellation techniques. The vertical PNP generates a first leakage current from the base-collector region. Another vertical PNP transistor is configured to generate a second leakage current, which is coupled to a current-mirror circuit. The output of the current-mirror circuit is configured to provide a cancellation effect on the first leakage current. The current-mirror circuit and vertical PNP may be configured such that the first leakage current is cancelled in a judicious amount, whereby the effects of leakage current and flare-out in the vertical PNP transistor are minimized or cancelled. The cancellation technique is applicable to temperature sensor circuits, thermal voltage generators, and bandgap circuits.

20 Claims, 7 Drawing Sheets

BASE-TO-SUBSTRATE LEAKAGE CANCELLATION

FIELD OF THE INVENTION

The present invention relates to vertical PNP transistors. More particularly, the present invention is related of extending the temperature based operating range of a vertical PNP transistor by minimizing the effects of flare-out and leakage currents.

BACKGROUND OF THE INVENTION

Bipolar junction transistors (BJTs) can be manufactured in a MOS process by using a vertical transistor structure. In one example, a vertical PNP transistor is fabricated by placing (e.g., diffusing) a p+ region inside an n-well, where the n-well is inside a p-substrate. Vertical PNP transistors are used, for example, in temperature sensor circuits, thermal voltage generators, and bandgap circuits.

The accuracy of temperature sensor that employs a vertical PNP transistor is poor for temperatures approaching 130 degrees Celsius and above. The reduced accuracy is largely due to higher order effects such as current that leaks from the base to collector junction area (i.e., between the n-well and the p+ material) in the vertical PNP transistors, as well as from other higher order effects. The higher order temperature inaccuracies can be reduced by increasing the current density of vertical PNP.

DETAILED DESCRIPTION OF THE PREFERRED EMBODIMENTS

Figure 1:
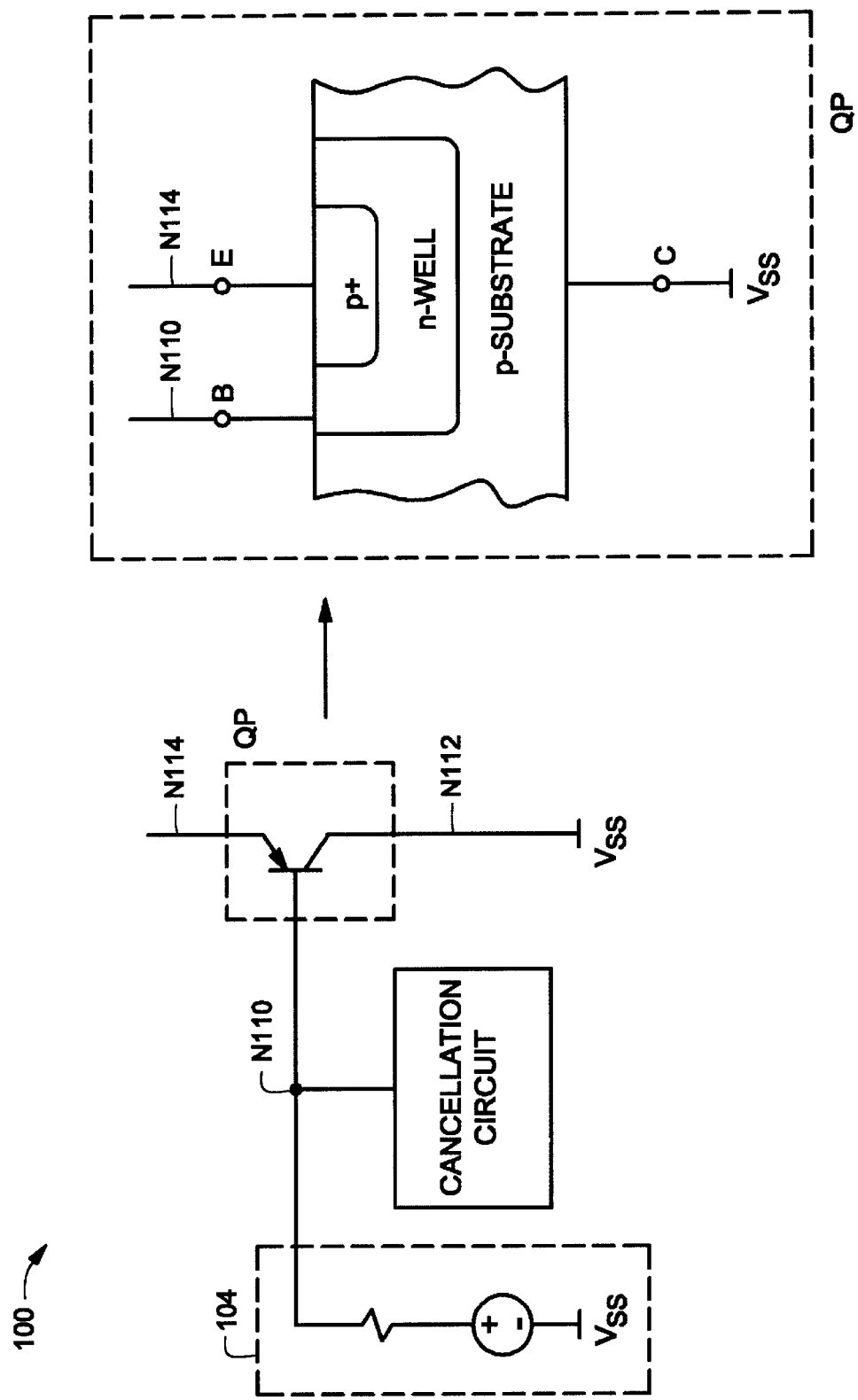
FIG. 1 illustrates an example circuit for extending the temperature range of a vertical PNP transistor.

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, or data signal. Referring to the drawings, like numbers indicate like parts throughout the views.

Briefly stated, the operating temperature range for a vertical PNP transistor can be extended by applying cancellation techniques, in accordance with the present invention. The vertical PNP generates a first leakage current from the base-collector region. Another vertical PNP transistor is configured to generate a second leakage current, which is coupled to a current-mirror circuit. The output of the current-mirror circuit is configured to provide a cancellation effect on the first leakage current The current-mirror circuit and vertical PNP may be configured such that the first leakage current is cancelled in a judicious amount, whereby the effects of leakage current and flare-out in the vertical PNP transistor are minimized or cancelled. The cancellation technique is applicable to temperature sensor circuits, thermal voltage generators, and bandgap circuits.

FIG. 1 illustrates an example circuit (100) for extending the temperature range of a vertical PNP transistor, according to aspects of the present invention. Circuit 100 includes vertical PNP transistor QP, cancellation circuit 102, and bias circuit 104. Transistor QP has a base that is coupled to node N110, an emitter that is coupled to node N114, and a collector that is coupled to node N112. Node N112 corresponds to the p substrate, which has an associated potential such as VSS. Cancellation circuit 102 has a port that is coupled to node N110. Bias circuit 104 has a port that is coupled to node N110.

In operation, circuit 100 operates as follows. Bias circuit 104 is configured to bias the base of transistor QP. Transistor QP is a vertical PNP transistor that includes: a p-type emitter region (p+ diffusion), an n-type base region (n-well), and a p-type collector region (p-substrate). The vertical PNP structure of transistor QP has a temperature dependent leakage characteristic between the base region (n-well) and the collector region (p-substrate). The leakage current from the base-collector region is provided by transistor QP to node N110, and therefore tends to pull node N110 down. Cancellation circuit 102 is configured to cancel part or all of the leakage current at node N110. According to one example, cancellation circuit 102 is configured to cancel a predetermined fraction of the leakage current such that flare-out effects are approximately cancelled by the remaining leakage.

Figure 2:
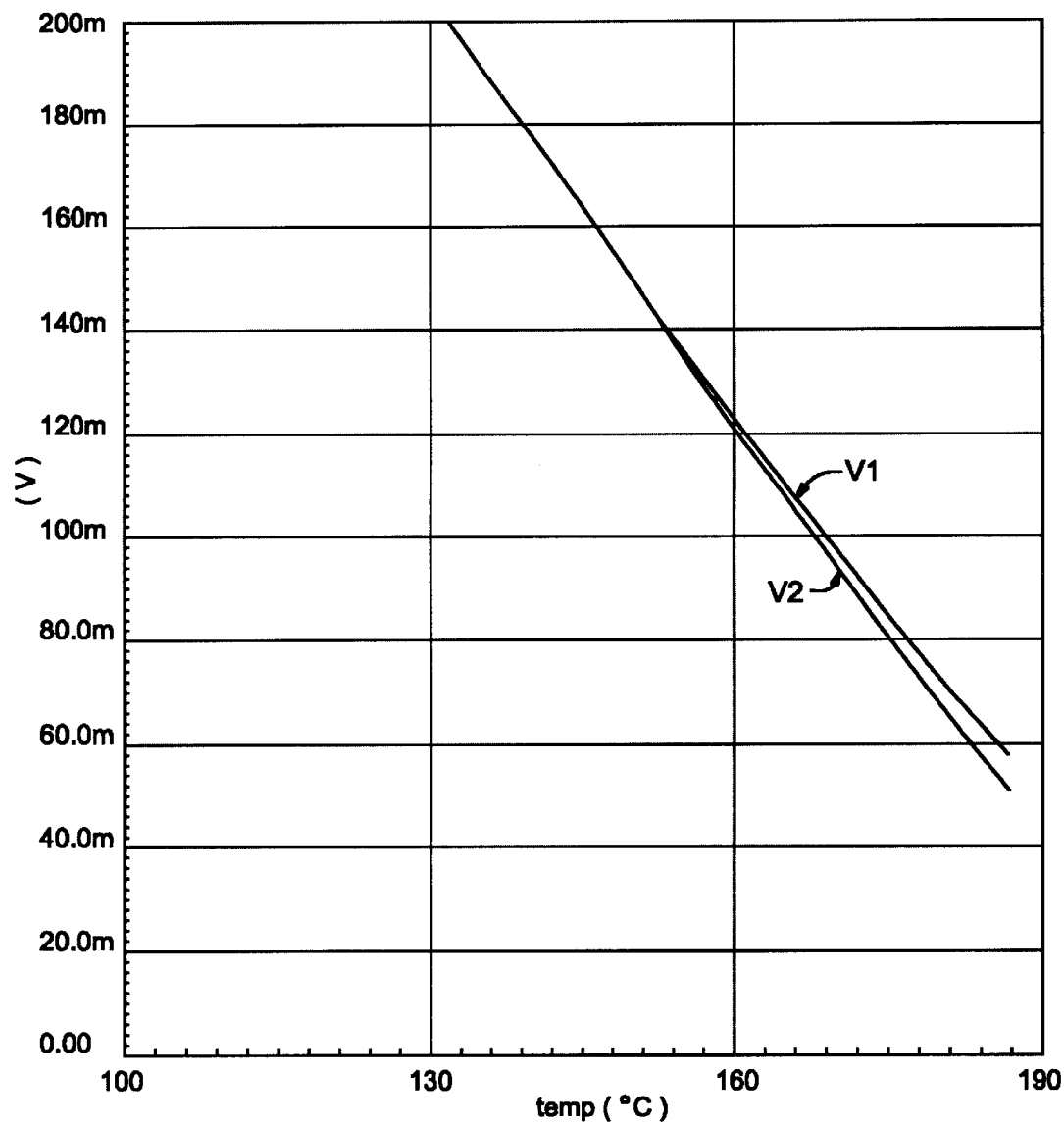
FIG. 2 is a graph illustrating the effects of flare-out on a junction voltage of a vertical PNP transistor.

Flare-out is a higher order effect that is illustrated by a non-linearity in the base-emitter junction voltage as it approaches 0 mV at very high temperature. Instead of following a straight line to 0 mV, it approaches 0 mV asymptotically. This is the opposite effect of leakage. By providing a small amount of leakage, the flare-out is cancelled. FIG. 2 is a graph illustrating the effects of flare-out on a junction voltage of a vertical PNP transistor Signal V1 corresponds to an emitter voltage of an example vertical PNP transistor with no leakage load. Signal V2 corresponds to an emitter voltage of another example vertical PNP transistor that is configured for a small amount of leakage, in accordance with aspects of the present invention. Signal V2 is approximately linear over the temperature range shown in FIG. 2, while signal V1 departs from ideal behavior by flaring out asymptotically as signal V1 approaches high temperatures (e.g., above 160 degrees C.).

Figure 3:
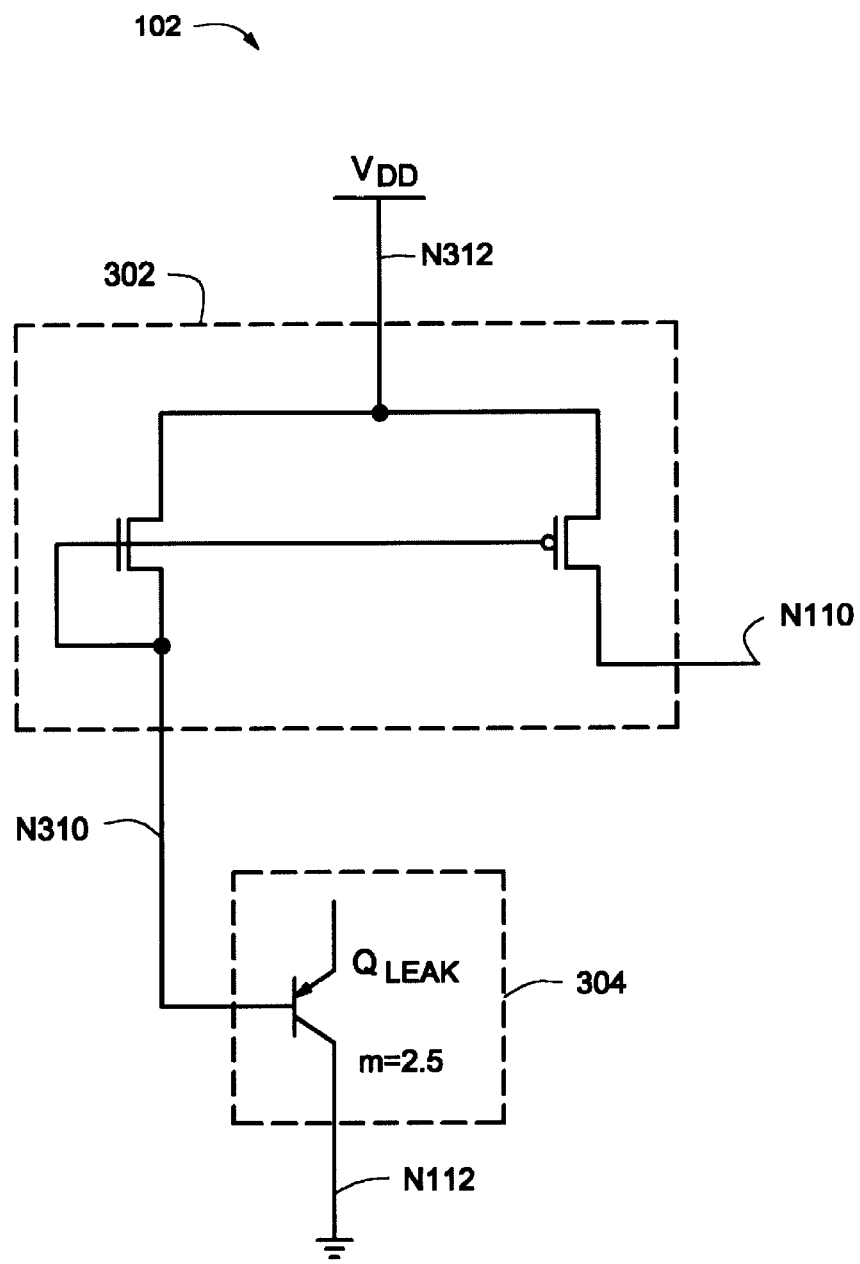
FIG. 3 illustrates an example embodiment of a cancellation circuit.

FIG. 3 illustrates an example embodiment of a cancellation circuit (102) that is arranged in accordance with the present invention. Cancellation circuit 102 includes a current-mirror circuit (302) and a leakage generator circuit (304). Leakage generator circuit 304 includes a vertical PNP transistor ($Q_{LEAK}$). Current-mirror circuit 302 has an input port that is coupled to node N310, and an output port that is coupled to node N110. PNP transistor $Q_{LEAK}$ has a base that is coupled to node N310, a collector that is coupled to node N112, and an emitter that is left open.

Leakage generator circuit 304 is configured to produce a leakage current that is comparable to the leakage current that is provided by transistor QP from FIG. 1. The leakage current from $Q_{LEAK}$ is provided by leakage generator circuit 304 to node N310. Current-mirror circuit 302 is configured to couple a reflected current to node N110 that is responsive to the leakage current from node N310. The reflected current cancels the effects of leakage currents from transistor QP (see FIG. 1) at node N110.

The total leakage current that is provided to node N310 for a given temperature may be adjusted by changing the total leakage area in the vertical PNP transistor, and/or by changing the reflection gain in the current-mirror circuit. According to one example embodiment, leakage generator circuit 304 corresponds to a single vertical PNP transistor ($Q_{LEAK}$) that has a base-collector junction area that is the same as that for transistor QP from FIG. 1. According to another example embodiment, leakage generator circuit 304 corresponds to a single vertical PNP transistor ($Q_{LEAK}$) that has a base-collector junction area that is different from that for transistor QP from FIG. 1. According to still another example embodiment, leakage generator circuit 304 includes multiple vertical PNP transistors that are coupled together (e.g., in parallel and/or serial). According to yet another example embodiment, the reflected leakage current is increased by the gain of the current mirror (e.g., 1×, 2×, etc.).

The reflected leakage current may correspond to a fractional amount of the total leakage current (e.g., a multiplier value of 2.5) relative to the leakage current from transistor QP. The fractional amount of reflected leakage current at node N110 may be carefully chosen such that the effects of both flare-out and current leakage on transistor QP are approximately cancelled. Flare-out and current leakage have opposite effects on emitter voltage of transistor QP. Refer to FIG. 2 and the associated text for a discussion of flare-out. The effects of both flare-out and current leakage can be cancelled by applying a judicious portion of reflected leakage current to the base of transistor QP.

Figure 4:
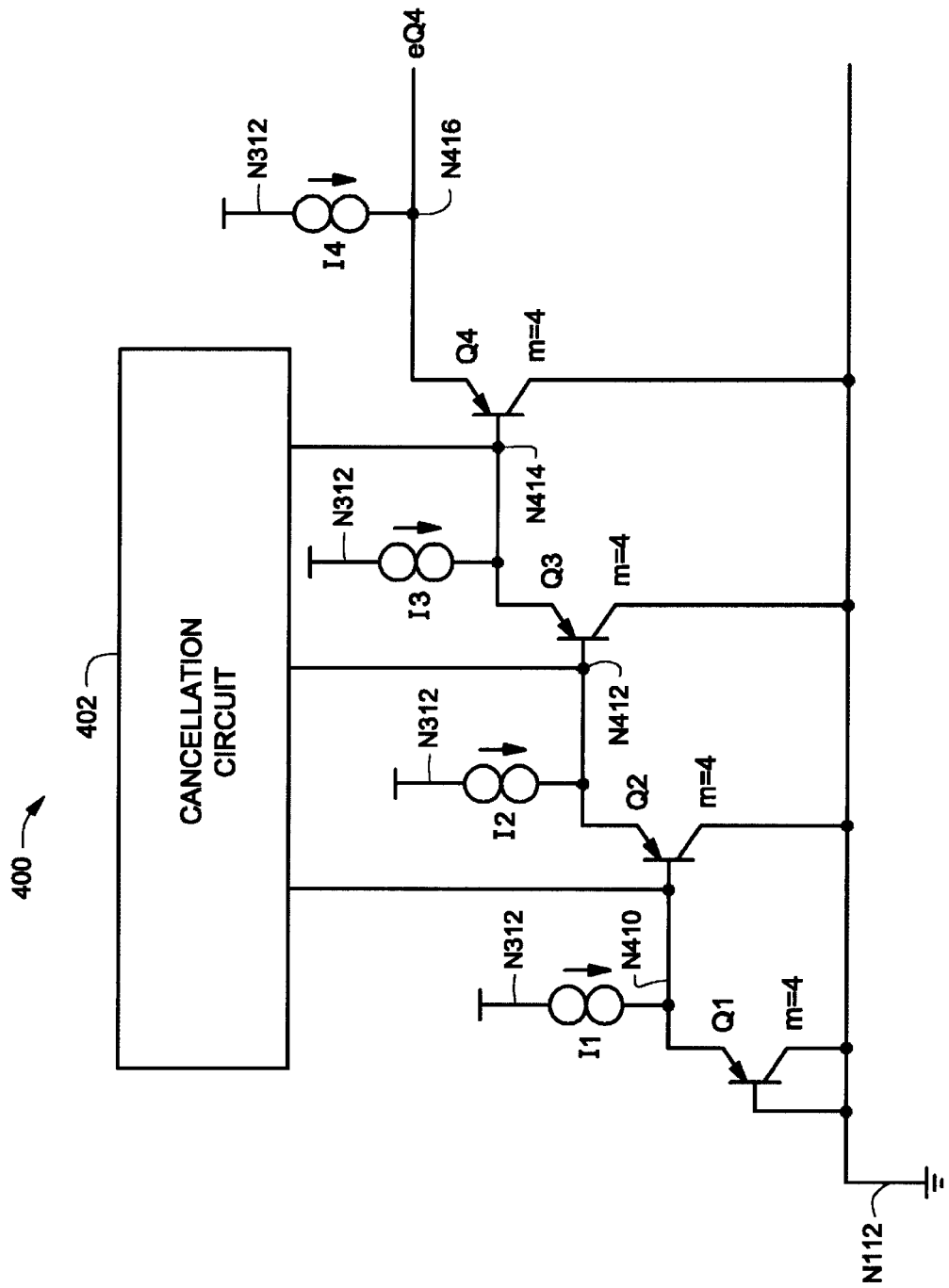
FIG. 4 illustrates an example embodiment of a temperature sensor circuit.

FIG. 4 illustrates an example embodiment of a temperature sensor circuit (400) that is arranged in accordance with aspects of the present invention. Temperature sensor circuit 400 includes cancellation circuit 402, current sources I1, I2, I3, and I4, and vertical PNP transistors Q1, Q2, Q3, and Q4.

Transistor Q1 has a collector that is coupled to node N112, a base that is coupled to node N112, and an emitter that is coupled to node N410. Transistor Q2 has a base that is coupled to node N410, a collector that is coupled to node N112, and an emitter that is coupled to node N412. Transistor Q3 has a base that is coupled to node N412, a collector that is coupled to node N112, and an emitter that is coupled to node N414. Transistor Q4 has a base that is coupled to node N414, a collector that is coupled to node N112, and an emitter that is coupled to node N416. Cancellation circuit 412 has a first port that is coupled to node N410, a second port that is coupled to node N412, and a third port that is coupled to node N414. Current source I1 is coupled between nodes N410 and N312. Current source I2 is coupled between nodes N412 and N312. Current source I3 is coupled between nodes N414 and N312. Current source I4 is coupled between nodes N416 and N312.

According to the example shown in FIG. 4, each of the transistors Q1–Q4 has a multiplier value of 4 (denoted by m=4). Additionally, each of the current sources (I1–I4) is arranged to provide a biasing current (e.g., less than 400 nA).

Figure 5:
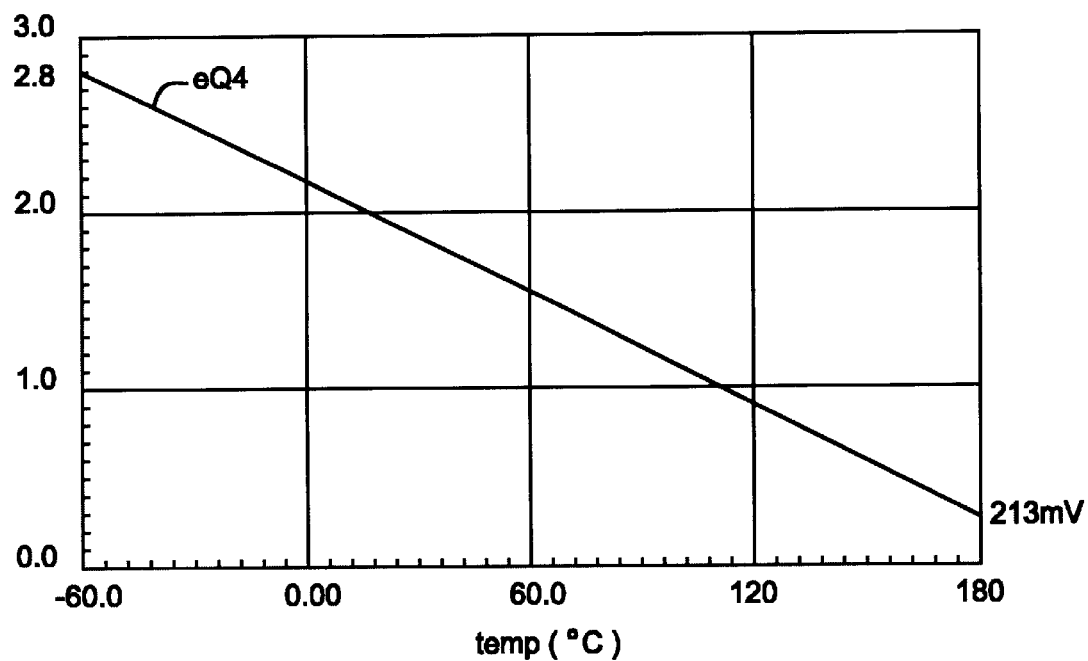
FIG. 5 is a graph illustrating the relationship between voltage and temperature in an example temperature sensor circuit.

In operation, an output signal (eQ4) is provided at node N416 that is associated with the cumulative base-emitter voltages of transistors Q1–Q4 (e.g., $4*V_{BE}$). The bias currents are relatively low (e.g., less than 400 nA), while the junction areas are relatively high (e.g., over 60) so that the overall current density for each transistor is low. Temperature sensor circuit 400 has very high sensitivity to temperature changes as a result of the low current density in each of transistors Q1–Q4. As illustrated in FIG. 5, signal eQ4 is approximately a linear function of temperature over a very wide temperature range (–60° C. through 180° C.) that includes temperatures well above 130° C.

Ideally, the base-emitter voltage of a PNP transistor linearly decreases with increasing temperature. However, the base-emitter voltage may have a non-linear temperature dependence when higher order effects are not cancelled. For example, current sources I1–I4 may be loaded down by leakage effects (as well as other higher order effects) such that the base-emitter voltages of vertical PNP transistors Q1–Q4 non-linearly decreases with increasing temperature. Temperature sensor applications at higher temperatures may be inaccurate at temperatures above approximately 130° C., where non-linear effects begin to dominate the base-emitter voltage of the PNP transistor.). Cancellation circuit 402 is arranged to cancel some leakage current and leave some leakage current to cancel flare-out so that temperature sensor 400 will be accurate at higher temperatures (e.g., up to 180° C.). Cancellation circuit 402 is configured to extend the temperature range for temperature sensor circuit 400 to include an extended linear range of approximately 130° C. to 180° C. Cancellation circuit 402 may be used to obtain good performance down to a junction voltage of approximately 60 mV or lower.

Figure 6:
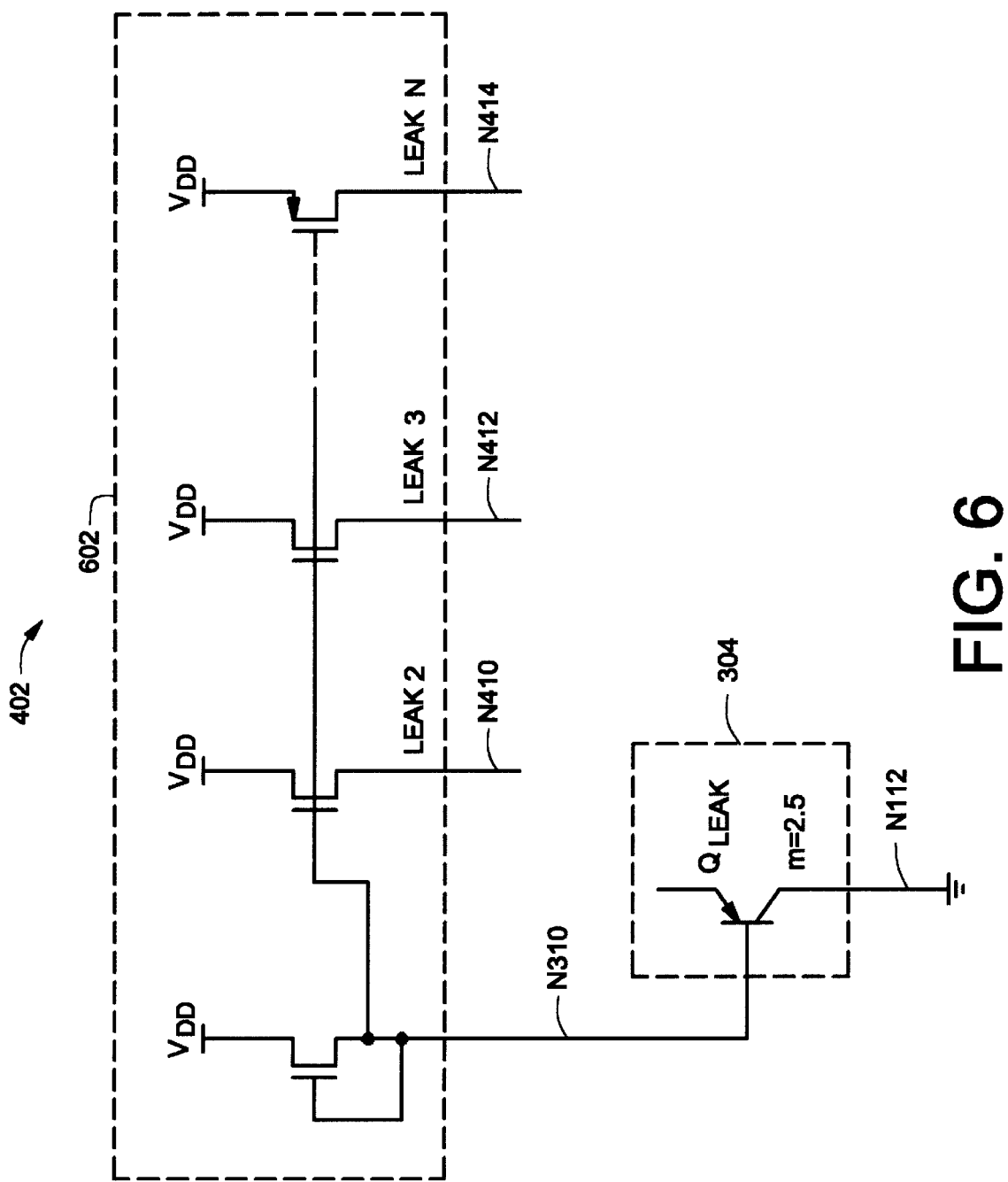
FIG. 6 illustrates an example embodiment of a cancellation circuit for the temperature sensor circuit that is illustrated in FIG. 4.

FIG. 6 illustrates an example embodiment of a cancellation circuit (402) for the temperature sensor circuit that is illustrated in FIG. 4. Cancellation circuit 402 includes a current-mirror circuit (602) and a leakage generator circuit (304). According to the example shown in FIG. 6, leakage generator circuit 304 includes a vertical PNP transistor ($Q_{LEAK}$).

Vertical PNP transistor $Q_{LEAK}$ has a base that is coupled to node N310, a collector that is coupled to node N112, and an emitter that is left open. Vertical PNP transistor $Q_{LEAK}$ has an input that is coupled to node N310, and an arbitrary number of outputs. In the example embodiment illustrated in FIG. 4, current-mirror circuit 602 has a first output that is coupled to node N410, a second output that is coupled to node N412, and a third output that is coupled to node N414.

Figure 7:
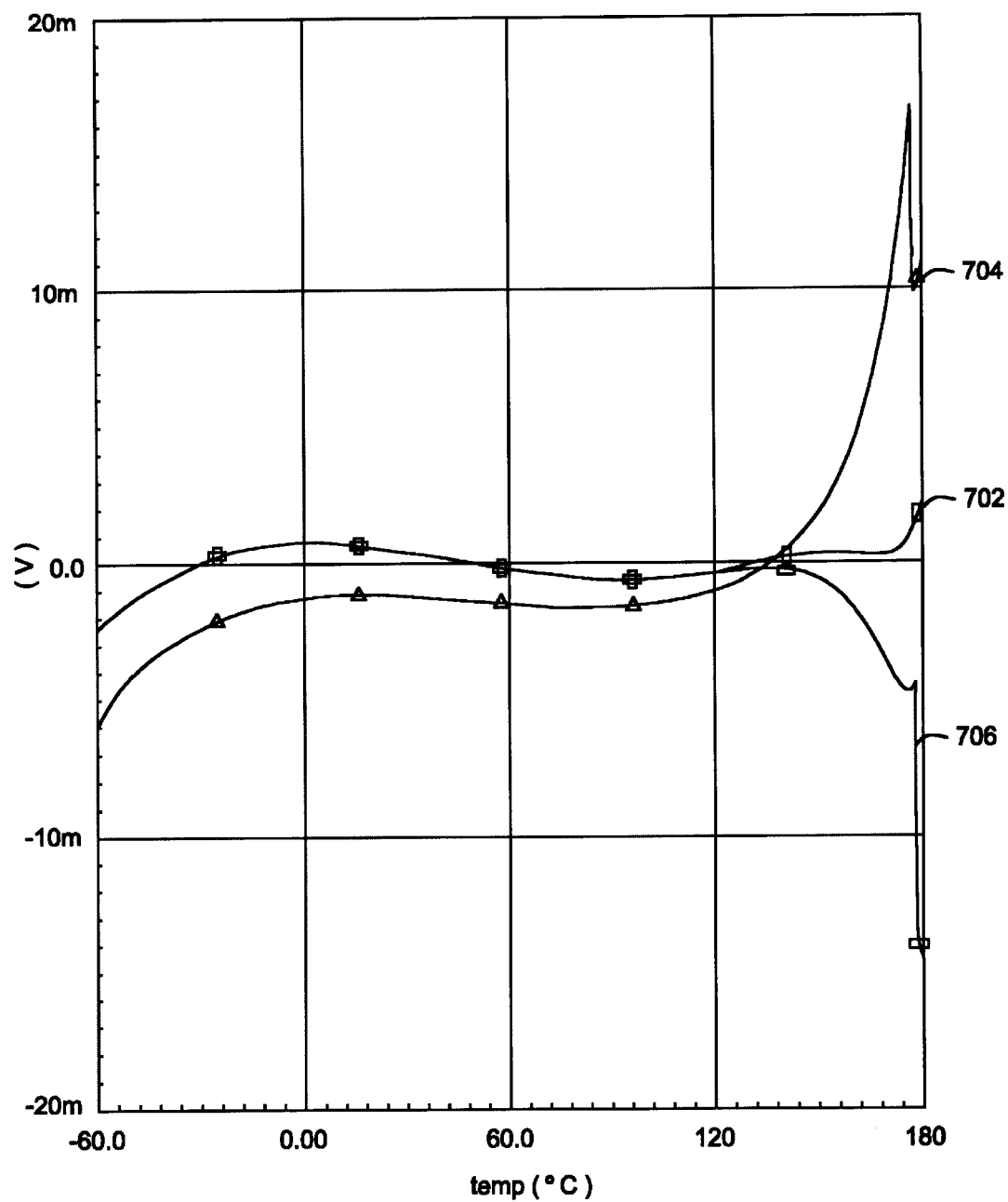
FIG. 7 is a graph illustrating the effects of cancellation for an example temperature sensor circuit, in accordance with aspects of the present invention.

Cancellation circuit 402 is operates in a substantially similar manner to cancellation circuit 102. However, current-mirror circuit 302 in cancellation circuitP 102 includes only one output port, while current-mirror circuit 602 has an arbitrary number of outputs ports. Each output port of current-mirror circuit 602 is arranged to couple reflected leakage currents to a respective vertical PNP transistor such that leakage effects and flare-out effects are minimized FIG. 7 is a graph illustrating the effects of cancellation for an example temperature sensor circuit that is arranged in accordance with aspects of the present invention. For each of the curves illustrated in FIG. 7, the signals represent a residue signal that denotes the difference between the ideal and non-ideal temperature dependent voltage curves. An ideal temperature dependent curve (See e.g., FIG. 5) has a parabolic component, a linear component, and an offset component. The residue signal is obtained by removing the parabolic, linear, and offset components from the non-ideal temperature dependent voltage curve. First, the offset portion is removed by subtracting the ideal voltage at 50° C. from every point on the non-ideal curve such that the first resulting curve crosses the 0 axis at 50° C. Next, the linear component is subtracted from the first resulting curve (where the linear line is defined in the temperature ranges of −30° C. to 130° C.) yielding a second resulting curve that has a parabolic shape. Lastly, the parabolic component (which is defined at temperatures −30° C., 50° C., and 130° C.) is subtracted from the second resulting curve yielding the residue signals depicted in FIG. 7. Signal 702 is representative of a residue for a temperature sensor with a judicious amount of cancellation (e.g., eQ4 from FIG, 4). Signal 704 is representative of a residue for a temperature sensor with complete cancellation of leakage effects. Signal 706 is representative of a residue for a temperature sensor without any cancellation.

Signal 706 is subject to the effects of leakage current. The voltage associated with signal 706 departs substantially from ideal behavior within the extended linear range (130 degrees Celsius to 180 degrees Celsius and above). For example, the voltage associated with signal 706 is approximately 16 mV less than the ideal at 180° C. Signal 704 is subject to the effects of flare-out. In the extended temperature range, the voltage associated with signal 704 departs significantly from the ideal. For example, the voltage associated with signal 704 is approximately 17 mV above the ideal voltage at approximately 175° C.

The magnitude of signal 702 does not depart substantially from the ideal behavior throughout the extended linear range. The effects of leakage current and flare-out are approximately cancelled out. For example, the voltage associated with signal 702 does not show significant flare-out effects until the temperature exceeds approximately 175 degrees Celsius, as noted by the 2 mV variation at a temperature of approximately 180° C.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus comprising:
a vertical PNP transistor that has an emitter region, a collector region, and a base region, wherein the vertical PNP transistor has a temperature dependent leakage characteristic associated with the base-collector regions, wherein the vertical PNP transistor is arranged to provide a reference voltage across the base and emitter regions;
another vertical PNP transistor that has another emitter region, another collector region, and another base region, wherein the other vertical PNP transistor has a temperature dependent leakage characteristic associated with the other base-collector regions, wherein the other emitter of the other vertical PNP transistor is floating; and
a current mirror circuit that has an input port that is coupled to the base region, and an output port that is coupled to the other base region, wherein the input port is arranged to sense a sense current, and the output port is arranged to provide a reflected current, whereby a temperature profile associated with the voltage across the base and emitter regions of the vertical PNP transistor is changed by the reflected current.

2. The apparatus of claim 1, wherein at least one of the current mirror circuit and the other vertical PNP transistor are arranged such that the temperature profile associated with the voltage across the base and emitter regions of the vertical PNP transistor is compensated for effects of leakage current and flare-out.

3. The apparatus as in claim 1, wherein the vertical PNP transistor has an area associated with the base-collector region, and the other vertical PNP transistor has another area associated with the other base-collector region, wherein the area and the other area are different from one another.

4. The apparatus as in claim 3, wherein the difference between the area of the vertical PNP transistor and the other area of the other vertical PNP transistor is selected such that the base-emitter voltage is approximately linear with respect to temperature for temperatures of approximately 130 degrees Celsius and above.

5. The apparatus as in claim 3, wherein the area of the vertical PNP transistor and the other area of the other vertical PNP transistor are related to one another by a factor of approximately 2.5.

6. The apparatus as in claim 1, wherein the current-mirror circuit is further arranged such that the reflected current that is approximately matched to the sense current, wherein the sense current substantially corresponds to the other leakage current from the other vertical PNP transistor.

7. The apparatus as in claim 1, wherein the current-mirror circuit is further arranged such that the reflected current is ratioed to the sense current by a gain factor, wherein the sense current substantially corresponds to the other leakage current from the other vertical PNP transistor, and the gain factor is selected such that the base-emitter voltage is approximately linear with respect to temperature for temperatures of approximately 130 degrees Celsius and above.

8. The apparatus as in claim 1, further comprising: an additional vertical PNP transistor that has an additional emitter region, an additional collector region, and an additional base region, wherein the additional vertical PNP transistor has a temperature dependent leakage characteristic associated with the additional base-collector regions, wherein the additional vertical PNP transistor is arranged to provide an additional reference voltage across the additional base and emitter region, wherein the current-mirror circuit has a second output port that is coupled to the additional base region of the additional vertical PNP transistor.

9. The apparatus as in claim 1, further comprising an additional vertical PNP that has an additional emitter region, an additional collector region, and an additional base region, wherein the additional vertical PNP transistor has an additional temperature dependent leakage characteristic associated with the additional base-collector regions, wherein the additional transistor is arranged in parallel with the other vertical PNP transistor such that the other transistor and the additional transistor have a combined area associated with a combined base-collector region such that effects of leakage current, flare-out, and other higher order effects are approximately cancelled at temperatures of 130 degrees and above.

10. An apparatus comprising:
a first vertical PNP transistor that includes a first base, a first emitter, and a first collector, wherein the first base and first collector are coupled together;

a second vertical PNP transistor that includes a second base, a second emitter, and a second collector, wherein the second base is coupled to the first emitter;

a third vertical PNP transistor that includes a third base, a third emitter, and a third collector, wherein the third base is coupled to the second emitter;

a fourth vertical PNP transistor that includes a fourth base, a fourth emitter, and a fourth collector, wherein the fourth base is coupled to the third emitter, wherein the first, second, third, and fourth vertical PNP transistors are arranged to provide a reference voltage at the fourth emitter;

a first current source that is coupled to the first emitter;

a second current source that is coupled to the second emitter;

a third current source that is coupled to the third emitter;

a fourth current source that is coupled to the fourth emitter;

a current-mirror circuit having a first output port that is coupled to the second base, a second output port that is coupled to the third base, and a third output port that is coupled to the fourth base; and a fifth vertical PNP transistor that includes a fifth base, a fifth emitter, and a fifth collector, wherein the fifth base is coupled to an input port of the current-mirror circuit, and wherein the fifth emitter is floating, wherein the first, second, third, fourth and fifth vertical PNP transistors each have a temperature dependent leakage characteristic that is associated with their respective base-collector regions.

11. The apparatus of claim 10, wherein the first, second, third, and fourth PNP transistors each have a multiplier value that approximately corresponds to four.

12. The apparatus of claim 10, wherein the fifth vertical PNP transistor has a multiplier value, and wherein the multiplier is selected such that effects of leakage current and flare-out on the reference voltage are approximately canceled for temperatures in a range from approximately 130 degrees Celsius to approximately 180 degrees Celsius.

13. The apparatus of claim 10, wherein the fifth vertical PNP transistor has a multiplier value that approximately corresponds to 2.5.

14. The apparatus of claim 10, wherein the apparatus is configured to provide an accurate reference voltage at 180 degrees Celsius, and wherein the junction voltage for each of the first, second, third, and fourth PNP transistors is less than 220 mV at 180 degrees Celsius.

15. The apparatus of claim 10, wherein each of the first, second, third, and fourth current sources is configured to provide a current of less than 400 nA.

16. An apparatus, comprising:

a vertical PNP transistor that has an emitter region, a collector region, and a base region, wherein the vertical PNP transistor has a temperature dependent leakage current that is associated with the base-collector regions, wherein the vertical PNP transistor is arranged to provide a reference voltage across the base and emitter regions; and a means for cancellation that is coupled to the base region of the vertical PNP transistor, wherein the means for cancellation is configured to provide a cancellation current such that a portion of the leakage current from the base-collector region is cancelled by the cancellation current.

17. The apparatus of claim 16, wherein the portion is less than one.

18. The apparatus of claim 16, the means for cancellation comprising:

a means for leakage generation that is arranged to provide another temperature dependent leakage current; and a current-mirror circuit having an output port that is coupled to the base of the vertical PNP transistor, and an input port that is coupled to the means for leakage generation such that the current-mirror circuit is responsive to the other temperature dependent leakage current.

19. The apparatus as in claim 18, wherein the means for leakage generation comprises another vertical PNP transistor that has a multiplier value that is less than one with respect to the vertical PNP transistor, and wherein the current mirror circuit is configured to provide a reflection gain from input to output that is approximately equal to one.

20. The apparatus as in claim 18, wherein the means for leakage generation comprises another vertical PNP transistor that has a multiplier value that is approximately equal to one with respect to the vertical PNP transistor, and wherein the current mirror circuit is configured to provide a reflection gain from input to output that is less than one.

\* \* \* \* \*

UNITED STATES PATENT AND TRADEMARK OFFICE
CERTIFICATE OF CORRECTION

PATENT NO.    : 6,777,781 B1
DATED         : August 17, 2004
INVENTOR(S)   : Perry Scott Lorenz It is certified that error appears in the above-identified patent and that said Letters Patent is hereby corrected as shown below:

Column 3,
Line 66, delete "12" and insert -- 12 --.

Column 4,
Line 1, delete "14" and insert -- I4 --.
Line 59, delete "circuitP" and insert -- circuit --.

Column 5,
Line 62, delete "region ," and insert -- region, --

Column 6,
Line 63, after "degress" insert -- Celsius --.

Column 7,
Lines 39-40, delete "canceled" and insert -- cancelled --.

Signed and Sealed this

Twenty-fourth Day of May, 2005

JON W. DUDAS
*Director of the United States Patent and Trademark Office*